(12) United States Patent
Kim et al.

(10) Patent No.: US 9,887,324 B2
(45) Date of Patent: Feb. 6, 2018

(54) LIGHT EMITTING DEVICE PACKAGE

(71) Applicant: LG INNOTEK CO., LTD., Seoul (KR)

(72) Inventors: Baek Jun Kim, Seoul (KR); Hiroshi Kodaira, Seoul (KR); Byung Mok Kim, Seoul (KR); Ha Na Kim, Seoul (KR); Yuichiro Tanda, Seoul (KR); Satoshi Ozeki, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 101 days.

(21) Appl. No.: 14/484,637

(22) Filed: Sep. 12, 2014

(65) Prior Publication Data
US 2015/0102375 A1 Apr. 16, 2015

(30) Foreign Application Priority Data

Sep. 16, 2013 (KR) .................. 10-2013-0111278
Sep. 16, 2013 (KR) .................. 10-2013-0111280
Sep. 16, 2013 (KR) .................. 10-2013-0111281

(51) Int. Cl.
*H01L 33/00* (2010.01)
*H01L 33/48* (2010.01)
(Continued)

(52) U.S. Cl.
CPC ............ *H01L 33/486* (2013.01); *H01L 33/36* (2013.01); *H01L 33/44* (2013.01); *H01L 33/56* (2013.01);
(Continued)

(58) Field of Classification Search
CPC ..... H01L 33/48; H01L 33/486; H01L 33/507; H01L 33/52; H01L 33/64; H01L 33/36;
(Continued)

(56) References Cited

U.S. PATENT DOCUMENTS 6,849,881 B1* 2/2005 Harle .................. B82Y 20/00
257/184
7,560,741 B2* 7/2009 Harle .................. H01L 33/486
257/98

(Continued)

FOREIGN PATENT DOCUMENTS

CN     102163675     8/2011
CN     102696123     9/2012
(Continued)

OTHER PUBLICATIONS

European Search Report issued in application No. 14184713.7 dated Jan. 23, 2015.
(Continued)

*Primary Examiner* — Vu A Vu
(74) *Attorney, Agent, or Firm* — Ked & Associates, LLP

(57) ABSTRACT

A light emitting device package is disclosed. The light emitting device package includes a package body including at least one ceramic layer, a submount disposed at the package body, a light emitting device disposed on the submount for emitting ultraviolet (UV)-wavelength light, and an anti-reflection (AR) coating layer disposed around the light emitting device, the AR coating layer being formed of an inorganic coating layer.

15 Claims, 18 Drawing Sheets

(51) Int. Cl.
- *H01L 33/44* (2010.01)
- *H01L 33/56* (2010.01)
- *H01L 33/36* (2010.01)
- *H01L 33/62* (2010.01)

(52) U.S. Cl.
CPC .............. *H01L 33/62* (2013.01); *H01L 33/48* (2013.01); *H01L 2224/48091* (2013.01); *H01L 2224/48145* (2013.01); *H01L 2224/49107* (2013.01); *H01L 2224/73265* (2013.01); *H01L 2924/16195* (2013.01); *H01L 2924/181* (2013.01)

(58) Field of Classification Search
CPC ......... H01L 33/44; H01L 33/56; H01L 33/62; H01L 2224/48091; H01L 2224/48145; H01L 2224/49107; H01L 2224/73265
USPC ......... 438/25–27, 29; 257/98–100, E33.056, 257/E33.058, E33.059
See application file for complete search history.

(56) References Cited

U.S. PATENT DOCUMENTS

| | | | |
|---|---|---|---|
| 8,044,424 B2* | 10/2011 | Urano | H01L 33/483 257/98 |
| 2002/0043926 A1* | 4/2002 | Takahashi | C03C 3/045 313/503 |
| 2006/0138443 A1* | 6/2006 | Fan | H01L 33/56 257/100 |
| 2006/0160257 A1* | 7/2006 | Wu | H01L 25/0753 438/22 |
| 2006/0274891 A1* | 12/2006 | Bhatt | G01N 23/046 378/199 |
| 2009/0103296 A1* | 4/2009 | Harbers | F21V 7/22 362/234 |
| 2010/0110695 A1* | 5/2010 | Nakamura | F21V 5/04 362/311.09 |
| 2011/0001148 A1* | 1/2011 | Sun | H01L 33/60 257/88 |
| 2011/0049538 A1 | 3/2011 | Yang | 257/88 |
| 2011/0164402 A1 | 7/2011 | Kang et al. | |
| 2011/0241025 A1 | 10/2011 | Sakamoto et al. | 257/88 |
| 2012/0002396 A1* | 1/2012 | Tseng | F21K 9/54 362/84 |
| 2012/0267671 A1* | 10/2012 | Jung | H01L 33/486 257/99 |
| 2012/0286308 A1* | 11/2012 | Lai | H01L 33/507 257/98 |
| 2012/0286310 A1* | 11/2012 | Kim | H01L 33/60 257/98 |
| 2013/0015478 A1 | 1/2013 | Oh et al. | |
| 2013/0078411 A1 | 3/2013 | Gaska et al. | |
| 2014/0203315 A1* | 7/2014 | Kim | G02B 19/0061 257/98 |
| 2015/0054017 A1* | 2/2015 | Hsing Chen | H01L 33/486 257/99 |

FOREIGN PATENT DOCUMENTS

| | | |
|---|---|---|
| CN | 103078033 | 5/2013 |
| EP | 1 880 139 | 1/2008 |
| EP | 2 355 190 A2 | 8/2011 |
| EP | 2 515 355 A2 | 10/2012 |
| EP | 2 562 832 A2 | 2/2013 |
| EP | 2 562 834 A2 | 2/2013 |
| JP | 2012-151436 | 8/2012 |
| JP | 2013-12753 | 1/2013 |
| JP | 2013-69620 | 4/2013 |
| KR | 10-2012-0009942 | 2/2012 |
| KR | 10-2013-0072990 | 7/2013 |
| KR | 10-2013-0081171 | 7/2013 |
| WO | WO 2006/119735 | 11/2006 |
| WO | WO 2013/044179 | 3/2013 |

OTHER PUBLICATIONS

Chinese Office Action dated Nov. 3, 2017 issued in Application No. 201410469502.9 (English translation attached).

\* cited by examiner

LIGHT EMITTING DEVICE PACKAGE

CROSS REFERENCE TO RELATED APPLICATION

This application claims priority under 35 U.S.C. §119 to Korean Patent Application Nos. 10-2013-0111278, 10-2013-0111280 and 10-2013-0111281 filed on Sep. 16, 2013, which are hereby incorporated in its entirety by reference as if fully set forth herein.

BACKGROUND

1. Field

Provided is a light emitting device and a light emitting device package having the same.

2. Background

Light emitting devices and light emitting device packages having the same are known. However, they suffer from various disadvantages.

BRIEF DESCRIPTION OF THE DRAWINGS

Arrangements and embodiments may be described in detail with reference to the following drawings in which like reference numerals refer to like elements and wherein.

DETAILED DESCRIPTION

Hereinafter, embodiments will be described with reference to the accompanying drawings.

It will be understood that when an element is referred to as being 'on' or 'under' another element, it can be directly on/under the element, and one or more intervening elements may also be present. When an element is referred to as being 'on' or 'under', 'under the element' as well as 'on the element' can be included based on the element.

A light emitting device, such as a light emitting diode (LED) or a laser diode, using a group III-V or II-VI compound semiconductor material may emit various colors, such as red, green, blue, and ultraviolet light, as the result of advances in thin film growth technology and materials for the device. In addition, the light emitting device may emit high-efficiency white light using a fluorescent material or through combination of colors. The light emitting device has advantages of lower power consumption, semi-permanent lifespan, rapid response time, safety, and environmentally friendliness, which are comparable with conventional light sources, such as a fluorescent lamp or an incandescent lamp.

Consequently, the light emitting device is increasingly applied to a transmission module of an optical communication means, a light emitting diode backlight replacing a cold cathode fluorescence lamp (CCFL) constituting a backlight of a liquid crystal display (LCD) apparatus, a light emitting diode lighting apparatus replacing a fluorescent lamp or an incandescent lamp, a headlight of a vehicle, and a signal light.

Figure 1A:
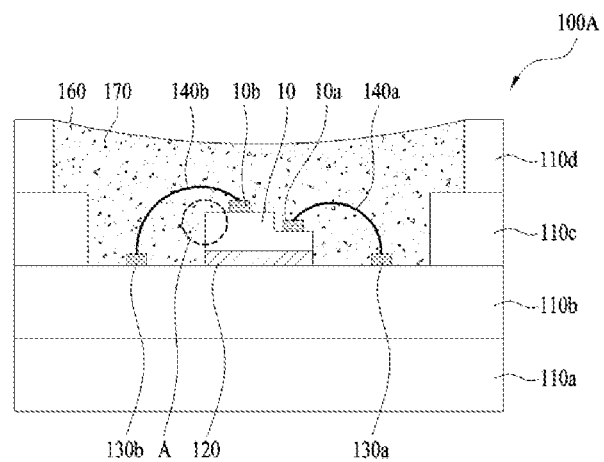
FIG. 1A is a view showing a light emitting device package.
Figure 1B:
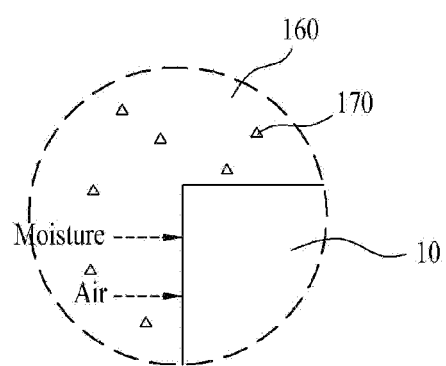
FIG. 1B is a detailed view showing a region A of FIG. 1A.

FIG. 1A is a view showing a light emitting device package and FIG. 1B is a detailed view of a region A of FIG. 1A. In the light emitting device package 100A, a cavity structure may be formed in package bodies 110a, 110b, 110c, and 110d, a light emitting device 10 may be disposed on the bottom of the cavity, and the light emitting device 10 may be bonded to the package body 110b constituting the bottom of the cavity via a paste layer 120.

A first electrode 10a and a second electrode 10b of the light emitting device 10 may be electrically connected to electrode pads 130a and 130b disposed on the package body 110b constituting the bottom of the cavity via wires 140a and 140b, respectively.

The cavity may be filled with a molding part 160. The molding part 160 may include a fluorescent substance 170. First-wavelength light emitted from the light emitting device 10 may excite the fluorescent substance 170 and second-wavelength light may be emitted from the fluorescent substance 170.

However, this type of light emitting device package may have various problems. For example, moisture or air may penetrate between the package bodies 110c and 110d and the molding part 160. Moisture or air may be absorbed by the light emitting device 10, thereby reducing optical or electrical properties of the light emitting device 10.

Figure 2:
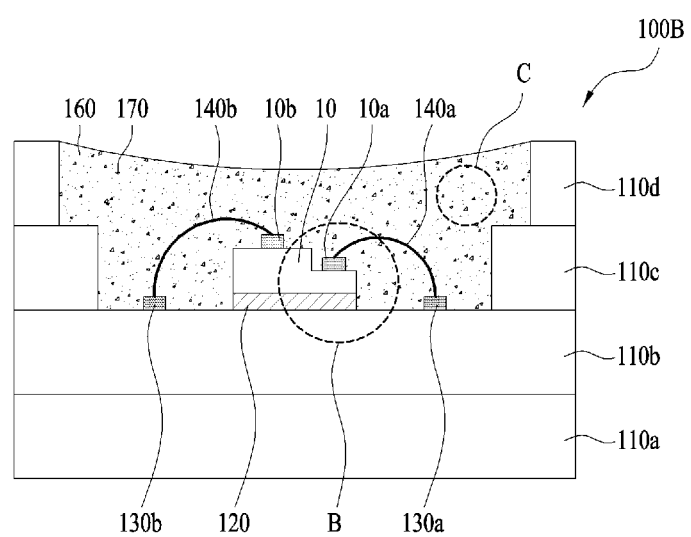
FIG. 2 is a view showing another light emitting device package.
Figure 3A:
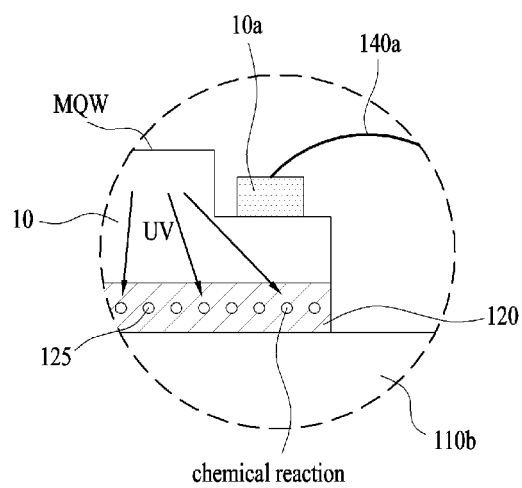
FIG. 3A is a detailed view showing a region B of FIG. 2.
Figure 3B:
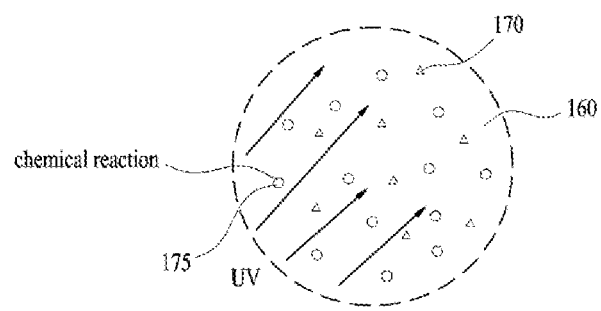
FIG. 3B is a detailed view showing a region C of FIG. 2.

FIG. 2 is a view showing another type of light emitting device package, FIG. 3A is a detailed view of a region B of FIG. 2, and FIG. 3B is a detailed view of a region C of FIG. 2.

Referring to FIGS. 2 and 3A, a paste layer 120 may include silicon (Si), silver (Ag), or epoxy. Particularly, the paste layer 120 may include organic matter 125, such as carbon compounds. When ultraviolet (UV)-wavelength light is emitted from a light emitting device 10, the organic matter 125 in the paste layer 120 may cause a chemical reaction due to UV as illustrated in FIG. 3A. For example, the organic matter 125 may react with UV, thereby discoloring the paste layer 120 or reducing coupling force thereof.

Referring to FIGS. 2 and 3A, a molding part 160 may include silicon or epoxy. Particularly, the molding part 160 may include organic matter 175, such as carbon compounds. When UV-wavelength light is emitted from the light emitting device 10, the organic matter 175 in the molding part 160 may cause a chemical reaction due to UV as shown in FIG. 2. For example, the organic matter 175 may react with UV, thereby discoloring the molding part 160.

Figure 4A:
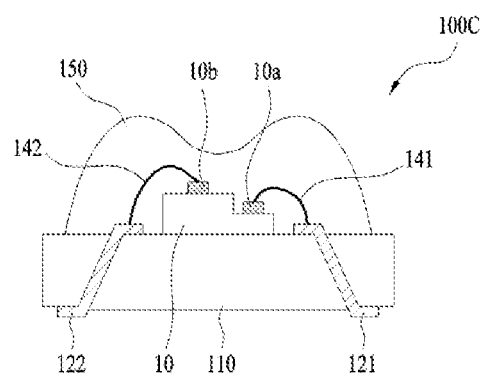
FIG. 4A is a view showing another light emitting device package.
Figure 4B:
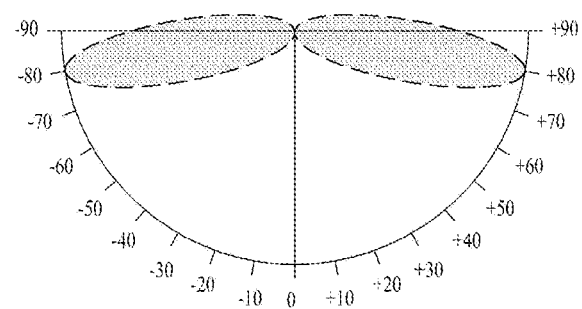
FIG. 4B is a view showing distribution of light emitted from the light emitting device package of FIG. 4A.

FIG. 4A is a view showing another type of light emitting device package and FIG. 4B is a view showing distribution of light emitted from the light emitting device package of FIG. 4A.

In the light emitting device package 100C, a first lead frame 121 and a second lead frame 122 are disposed at a package body 110 and a light emitting device 10 is electrically connected to the first lead frame 121 and the second lead frame 122.

The first lead frame 121 and the second lead frame 122 may extend through the package body 110. The light emitting device 10 may be disposed at one side of the package body 110. Here, a first electrode 10a and a second electrode 10b of the light emitting device 10 may be electrically connected to the first lead frame 121 and the second lead frame 122 via wires 141 and 142, respectively.

A lens 150 may be disposed on the light emitting device 10 to change a direction of light emitted from the light emitting device 10. A section of the lens 150 may be configured such that the height of a middle portion of the lens 150 corresponding to the light emitting device 10 is relatively low.

A major portion of light emitted from the light emitting device package of FIG. 4A advances within an angle range of 60 to 90 degrees as illustrated in FIG. 4B. As a result, the amount of light advancing to the front of the light emitting device package may be too small.

A light emitting device and light emitting device package having the same as broadly described and embodied hereinafter addresses these and other disadvantages of the light emitting device package of FIGS. 1 to 4.

Figure 5:
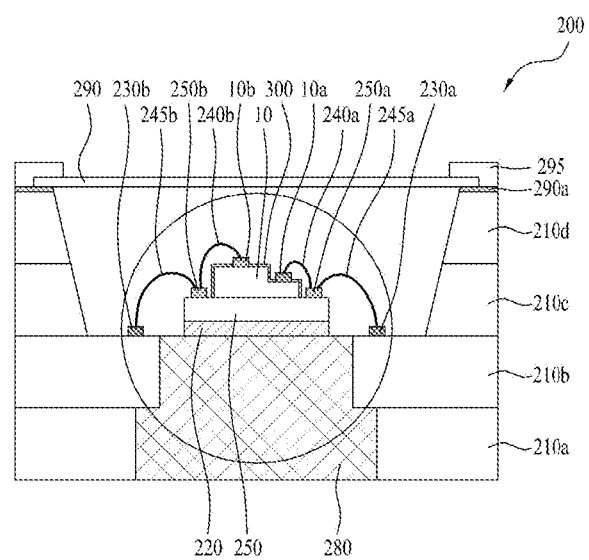
FIG. 5 is a view of a light emitting device package of the present disclosure.

FIG. 5 is a view of a light emitting device package according to one embodiment. The light emitting device package 200 may include a package body constituted by a plurality of ceramic layers 210a, 210b, 210c, and 210d. The package body may be formed using High Temperature Cofired Ceramics (HTCC) or Low Temperature Cofired Ceramics (LTCC) technology.

In a case in which the package body is a multi-layer ceramic substrate, the respective layers may have the same thickness or different thicknesses. The package body may be formed of an insulative nitride or oxide. For example, the package body may include $SiO_2$, $Si_xO_y$, $Si_3N_y$, $SiO_xN_y$, $Al_2O_3$, or AlN.

Some ceramic layers 210a and 210b may constitute the bottom of a cavity or the light emitting device package 200. The other ceramic layers 210c and 210d may constitute the sidewall of the cavity. A light emitting device 10 may be disposed on the bottom of the cavity constituted by the ceramic layers 210a and 210b. Two or more light emitting devices 10 may be disposed.

The light emitting device 10 may be disposed on a submount 250. The light emitting device 10 may be eutectically bonded to the submount 250 using metal. The submount 250 may contact or may be coupled to the bottom of the cavity via an inorganic paste layer 220. The ceramic layer 210b or a heat sink 280 may be disposed on the bottom of the cavity, on which the submount 250 is disposed.

The inorganic paste layer 220 may be formed of only inorganic matter without inclusion of organic matter, such as carbon compounds. More specifically, the inorganic paste layer 220 may include conductive or nonconductive inorganic matter. Particularly, the inorganic paste layer 220 may include at least one selected from among Au, Ag, and Sn.

When ultraviolet (UV)-wavelength light is emitted from the light emitting device 10, the inorganic matter in the inorganic paste layer 220 does not react with UV. Consequently, the inorganic paste layer 220 may not be discolored and coupling force thereof may not be reduced.

The heat sink 280 may be formed of a material exhibiting high thermal conductivity. Particularly, the heat sink 280 may be formed of CuW (copper-tungsten). In FIG. 2, one heat sink 280 is shown. However, two or more heat sinks 280 may be disposed in a separate manner.

The heat sink 280 may be disposed in the ceramic layers 210a and 210b. Although not shown, another thin ceramic layer may be disposed on the heat sink 280 and the ceramic layers 210a and 210b to prevent thermal expansion of the ceramic layers 210a and 210b.

Figure 6A:
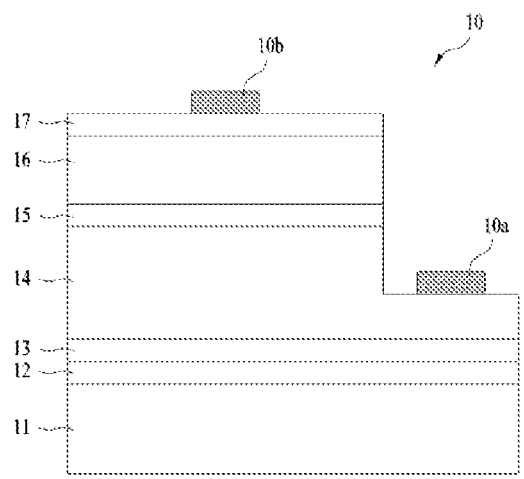
FIGS. 6A and 6B are views showing a light emitting device in a light emitting device package.
Figure 6B:
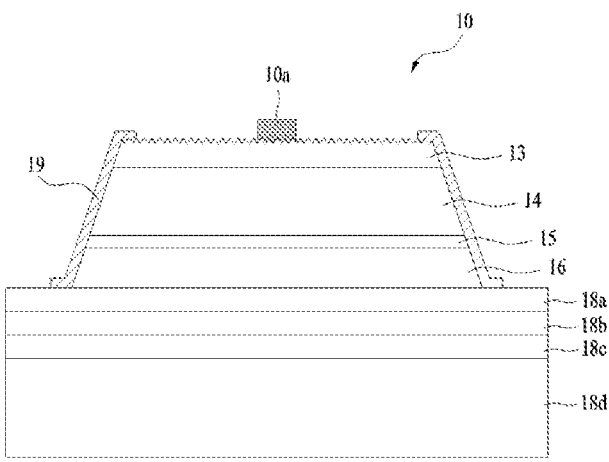

FIGS. 6A and 6B are views showing embodiments of a light emitting device in a light emitting device package. Referring to FIG. 6A, in the light emitting device 10, a buffer layer 12 and a light emitting structure may be disposed on a substrate 11. The substrate 11 may be formed of a material suitable for semiconductor material growth or a carrier wafer. In addition, the substrate 11 may be formed of a material exhibiting high thermal conductivity. The substrate 11 may include a conductive substrate or an insulative substrate. For example, the substrate 11 may be formed of at least one selected from among sapphire ($Al_2O_3$), $SiO_2$, SiC, Si, GaAs, GaN, ZnO, GaP, InP, Ge, and $Ga_2O_3$.

The buffer layer 12 may be provided to reduce lattice mismatch in material and difference in coefficient of thermal expansion between the substrate 11 and the light emitting structure. The buffer layer 12 may be formed of a group III-V compound semiconductor. For example, the buffer layer 12 may be formed of at least one selected from among AlAs, GaN, InN, InGaN, AlGaN, InAlGaN, and AlInN in addition to AlN.

When the substrate 11 is formed of sapphire and a light emitting structure including GaN or AlGaN is disposed on the substrate 11, lattice mismatch between GaN or AlGaN and sapphire is very great and difference in coefficient of thermal expansion therebetween is very great. As a result, dislocation, melt-back, crack, pit, and poor surface morphology, which deteriorate crystallinity, may occur. For this reason, the buffer layer 12 may be used.

An undoped GaN layer 13 or AlGaN layer may be disposed between the buffer layer 12 and the light emitting structure to prevent dislocation in the light emitting structure. In addition, dislocation in the buffer layer 12 may be prevented, whereby it may be possible to grow a high-quality/high-crystallinity buffer layer.

The light emitting structure may include a first conductive semiconductor layer 14, an active layer 15, and a second conductive semiconductor layer 16. The first conductive semiconductor layer 14 may be formed of a group III-V or II-VI compound semiconductor, which may be doped with a first conductive dopant. The first conductive semiconductor layer 14 may be formed of at least one selected from among a semiconductor material having a formula of $Al_xIn_yGa_{(1-x-y)}N$ ($0 \le x \le 1$, $0 \le y \le 1$, $0 \le x+y \le 1$), AlGaN, GaN, InAlGaN, AlGaAs, GaP, GaAs, GaAsP, and AlGaInP.

In a case in which the first conductive semiconductor layer 14 is an n-type semiconductor layer, the first conductive dopant may include an n-type dopant, such as Si, Ge, Sn, Se, or Te. The first conductive semiconductor layer 14 may be a single-layer semiconductor layer or a multi-layer semiconductor layer. However, embodiments are not limited thereto.

In a case in which the light emitting device 10 is a UV, deep UV, or non-polar light emitting device, the first conductive semiconductor layer 14 may include at least one selected from between InAlGaN and AlGaN. In a case in which the first conductive semiconductor layer 14 is formed of AlGaN, the content of Al may be 50%. In a case in which the light emitting device emits UV or deep UV, GaN may absorb a large amount of deep UV. For this reason, the light emitting structure may be formed of AlGaN.

The active layer 15 may be disposed between the first conductive semiconductor layer 14 and the second conductive semiconductor layer 16. The active layer 15 may include at least one selected from among a single well structure, a multi well structure, a single quantum well structure, and a multi quantum well (MQW) structure, a quantum dot structure, and a quantum wire structure.

The active layer 15 may be formed to have at least one pair structure of a well layer and a barrier layer selected from among AlGaN/AlGaN, InGaN/GaN, InGaN/InGaN, AlGaN/GaN, InAlGaN/GaN, GaAs(InGaAs)/AlGaAs, and GaP(InGaP)/AlGaP using a group III-V compound semiconductor material. However, embodiments are not limited thereto. The well layer may be formed of a material having an energy band gap lower than that of the barrier layer. Particularly, in this embodiment, the active layer 15 may generate UV-wavelength or deep UV-wavelength light. In this case, the active layer 15 may have a multi quantum well structure. Specifically, the active layer 15 may have a multi quantum well structure in which a pair of a quantum wall layer including $Al_xGa_{(1-x)}N$ ($0<x<1$) and a quantum well layer including $Al_yGa_{(1-y)}N$ ($0<x<y<1$) is one cycle or more. The quantum well layer may include a second conductive dopant, which will hereinafter be described.

The second conductive semiconductor layer 16 may be formed of a compound semiconductor. The second conductive semiconductor layer 16 may be formed of a group III-V or II-VI compound semiconductor, which may be doped with a second conductive dopant. The second conductive semiconductor layer 16 may be formed of at least one selected from among a semiconductor material having a formula of $In_xAl_yGa_{1-x-y}N$ ($0 \le x \le 1$, $0 \le y \le 1$, $0 \le x+y \le 1$), AlGaN, GaN AlInN, AlGaAs, GaP, GaAs, GaAsP, and AlGaInP.

In a case in which the second conductive semiconductor layer 16 is a p-type semiconductor layer, the second conductive dopant may be a p-type dopant, such as Mg, Zn, Ca, Sr, or Ba. The second conductive semiconductor layer 16 may be a single-layer semiconductor layer or a multi-layer semiconductor layer. However, embodiments are not limited thereto. In a case in which the light emitting device 10 is a UV, deep UV, or non-polar light emitting device, the second conductive semiconductor layer 16 may include at least one selected from between InAlGaN and AlGaN.

Although not shown, an electron blocking layer may be disposed between the active layer 15 and the second conductive semiconductor layer 16. The electron blocking layer may have a superlattice structure. For example, AlGaN doped with the second conductive dopant may be disposed in the superlattice. A plurality of GaN layers having different composition ratios of aluminum may be alternately disposed.

A GaN layer 17 may be disposed on the light emitting structure to uniformly supply current over a wide area from the second electrode 10b to the second conductive semiconductor layer 16. In a case in which the substrate 11 is an insulative substrate, the GaN layer 17 to a portion of the first conductive semiconductor layer 14 may be mesa etched to expose a portion of the first conductive semiconductor layer 14 such that current is supplied to the first conductive semiconductor layer 14.

A first electrode 10a may be disposed on the exposed first conductive semiconductor layer 14 and a second electrode 10b may be disposed on the GaN layer 17. The first electrode 10a and/or the second electrode 10b may be formed of a conductive material, such as metal. More specifically, the first electrode 10a and/or the second electrode 10b may be formed of Ag, Ni, Al, Rh, Pd, Ir, Ru, Mg, Zn, Pt, Au, Hf, or a selective combination thereof. In addition, the first electrode 10a and/or the second electrode 10b may have a single-layer structure or a multi-layer structure.

FIG. 6B shows a vertical light emitting device. Referring to FIG. 6B, an undoped GaN layer 13 may be disposed on a light emitting structure including a first conductive semiconductor layer 14, an active layer 15, and a second conductive semiconductor layer 16 and irregularities are formed at the surface of the undoped GaN layer 13 to improve a light extraction structure.

A first electrode 10a may be disposed on the undoped GaN layer 13 and a second electrode may be disposed under the light emitting structure. An ohmic layer 18a, a reflective layer 18b, a bonding layer 18c, and a conductive support 18d may function as the second electrode.

A passivation layer 19 may be disposed around the light emitting structure. The passivation layer 19 may be formed of an insulative material, such as a nonconductive oxide or nitride. For example, the passivation layer 19 may be formed of a silicon oxide ($SiO_2$) layer, an oxide nitride layer, or an aluminum oxide layer.

The ohmic layer 18a may have a thickness of about 200 Å. The ohmic layer 18a may include at least one selected from among indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, $IrO_x$, $RuO_x$, NiO, $RuO_x$/ITO, Ni/$IrO_x$/Au, Ni/$IrO_x$/Au/ITO, Ag, Ni, Cr, Ti, Al, Rh, Pd, Ir, Sn, In, Ru, Mg, Zn, Pt, Au, or Hf. However, embodiments are not limited thereto.

The reflective layer 18b may be formed of a metal layer including aluminum (Al), silver (Ag), nickel (Ni), platinum (Pt), rhodium (Rh), or an alloy including Al, Ag, Pt, or Rh. Aluminum or silver may effectively reflect light generated from the active layer 15, thereby greatly improving light extraction efficiency of the light emitting device.

The conductive support 18d may be formed of a metal exhibiting high electrical conductivity. In addition, the conductive support 18d may be formed of a metal exhibiting high thermal conductivity since it is necessary for the conductive support 18d to sufficiently dissipate heat generated during operation of the light emitting device.

The conductive support 18d may be formed of a metal or a semiconductor material. In addition, the conductive support 18d may be formed of a material exhibiting high electrical conductivity and thermal conductivity. For example, the conductive support 18d may be formed of a material such as molybdenum (Mo), silicon (Si), tungsten (W), copper (Cu), and aluminum (Al) or an alloy thereof. In addition, the conductive support 18d may selectively include gold (Au), copper alloy (Cu Alloy), nickel (Ni), copper-tungsten (Cu—W), and a carrier wafer (e.g. GaN, Si, Ge, GaAs, ZnO, SiGe, SiC, SiGe, or Ga2O3).

The conductive support 18d may have mechanical strength, by which the entirety of the nitride semiconductor is prevented from being bent while the conductive support 18d is easily cut into individual chips through a scribing process and a breaking process.

The bonding layer 18c may couple the reflective layer 18b to the conductive support 18d. The bonding layer 18c may be formed of a material including gold (Au), tin (Sn), indium (In), aluminum (Al), silicon (Si), silver (Ag), nickel (Ni), or copper (Cu) or an alloy thereof.

The ohmic layer 18a and the reflective layer 18b may be formed by sputtering or electron beam deposition. The conductive support 18d may be formed by electrochemical metal deposition or bonding using a eutectic metal or an additional bonding layer 18c may be formed.

The light emitting device 10 may be configured as a flip chip type light emitting device in addition to the horizontal light emitting device or the vertical light emitting device as described above.

The first electrode 10a and the second electrode 10b of the light emitting device 10 may be electrically connected to two bonding pads 250a and 250b on the submount 250 via wires 240a and 240b, respectively. The two bonding pads 250a and 250b on the submount 250 may be electrically connected to two electrode pads 230a and 230b disposed on the bottom of the cavity via wires 245a and 245b, respectively. The electrode pads 230a and 230b and the bonding pads 250a and 250b may be formed of inorganic matter, such as Au.

The wires 240a, 240b, 245a, and 245b may also be formed of inorganic matter, such as Au, and may have a diameter of 1 to 1.5 mil. If the wires are too thin, the wires may be broken or damaged. If the wires are too thick, the wires may block or absorb light. 1 mil is about 1/40 millimeter.

A molding part including a fluorescent substance may be disposed in the cavity surrounding the light emitting device 10 and the wires 240a, 240b, 245a, and 245b. The cavity may be filled with air or may be under vacuum.

An anti-reflection (AR) coating layer 300 may be disposed around the light emitting device 10. The AR coating layer 300 may be formed of only inorganic matter without inclusion of organic matter, such as carbon compounds. More specifically, the AR coating layer 300 may include at least one of MgF2, SiO2, or TiO2.

A cover layer 290 may be disposed on the uppermost ceramic layer 210d. The cover layer 290 may be formed of transparent glass. The cover layer 290 may be coupled to the ceramic layer 210d via an inorganic paste layer 290a. The inorganic paste layer 290a may have the same composition as the inorganic paste layer 220 as described above. In another example, the cover layer 290 and the ceramic layer 210d may be fixed by eutectic bonding or welding to hermetically seal the interior of the cavity. A lead 295 may be disposed at the edge of the cover layer 290 to hermetically seal the edge of the cover layer 290.

The inorganic paste layer 290a may be formed of only inorganic matter without inclusion of organic matter, such as carbon compounds. More specifically, the inorganic paste layer 290a may include conductive or nonconductive inorganic matter. Particularly, the inorganic paste layer 290a may include at least one of Au, Ag, or Sn.

When UV-wavelength light is emitted from the light emitting device 10, the inorganic matter in the inorganic paste layer 290a does not react with UV. Consequently, the inorganic paste layer may not be discolored and coupling force thereof may not be reduced.

Figure 7A:
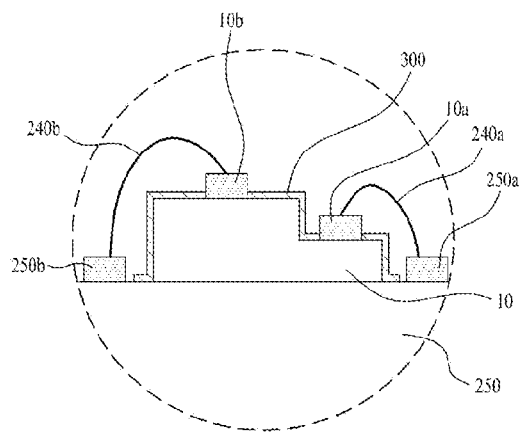
FIGS. 7A and 7B are detailed views showing the surroundings of a light emitting device shown in FIG. 5.
Figure 7B:
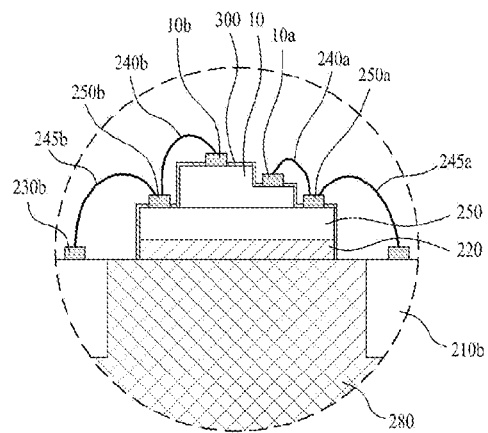
Figure 7C:
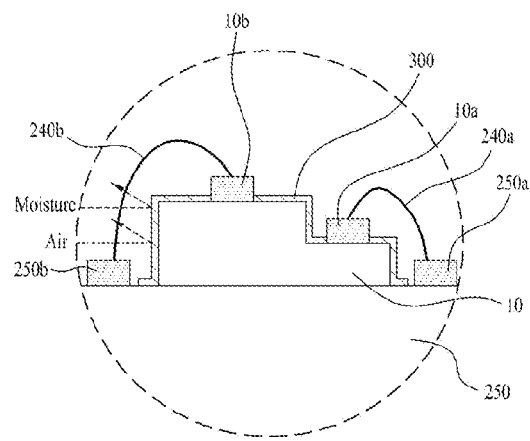
FIG. 7C is a view showing operation of an anti-reflection (AR) coating layer shown in FIG. 5.

FIGS. 7A and 7B are detailed views showing the surroundings of the light emitting device shown in FIG. 5 and FIG. 7C is a view showing operation of the AR coating layer shown in FIG. 5.

Referring to FIG. 7A, the AR coating layer 300 may be disposed to cover the top and the side of the light emitting device 10. A portion of the AR coating layer 300 may also be disposed at a portion of the submount 250.

The bonding pads 250a and 250b and the first electrode 10a and the second electrode 10b may have different thicknesses. However, the thicknesses thereof may be greater than that of the AR coating layer 300. The wires 240a and 240b may be bonded to the first electrode 10a and the second electrode 10b and the bonding pads 250a and 250b protruding outward from the AR coating layer 300.

In FIG. 7A, the AR coating layer 300 may be disposed at the light emitting device 10 and insides of the bonding pads 250a and 250b such that the AR coating layer 300 does not overlap the bonding pads 250a and 250b. FIG. 7B is different from FIG. 7A in that the AR coating layer 300 extends such that the AR coating layer 300 is disposed at the top and the side of the submount 250.

Moisture or air may penetrate the cavity. Even in a case in which the cavity is not evacuated but is filled with resin, moisture or air may penetrate the cavity. At this time, moisture or air may be blocked by the AR coating layer 300 such that optical or electrical properties of the light emitting device are not reduced as illustrated in FIG. 7C.

Figure 8A:
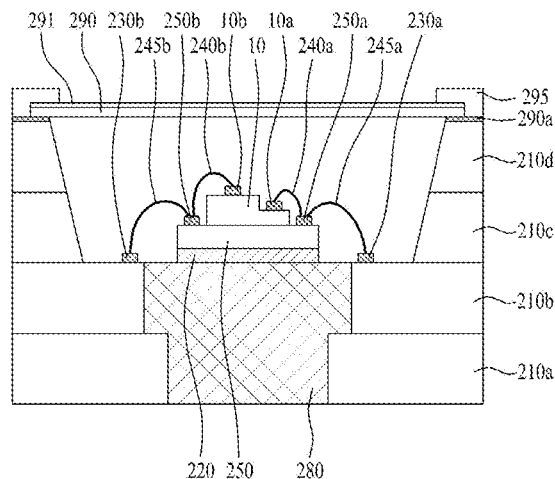
FIGS. 8A and 8B are views showing a light emitting device package having an AR coating layer.
Figure 8B:
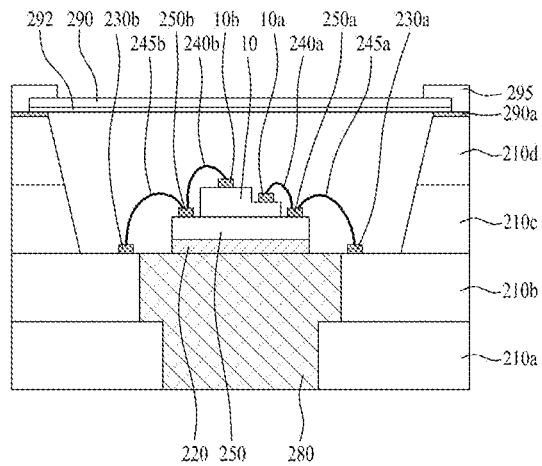

FIGS. 8A and 8B are views showing a light emitting device package according to the present disclosure. In FIG. 8A, an AR coating layer 291 may be disposed at the top of a cover layer 290, which is formed of inorganic matter. In FIG. 8B, an AR coating layer 292 may be disposed at the bottom of a cover layer 290, which is formed of inorganic matter. In FIGS. 8A and 8B, the AR coating layer is not formed around the light emitting device 10. Alternatively, the AR coating layer may be formed in the same manner as in FIG. 7A or 7B.

The AR coating layer 291 or 292 disposed at at least one side of the cover layer 290 may prevent moisture or air from penetrating the cavity such that optical or electrical properties of the light emitting device are not reduced.

Figure 9A:
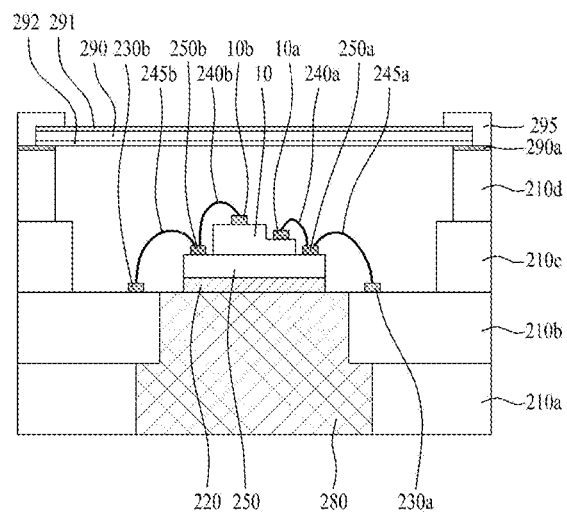
FIGS. 9A and 9B are views showing a light emitting device package of the present disclosure.
Figure 9B:
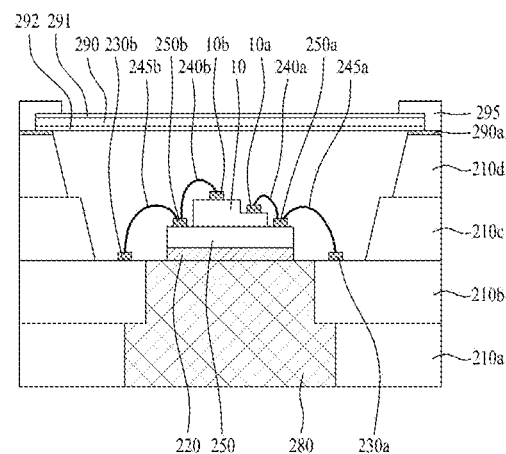

FIGS. 9A and 9B are views showing another light emitting device package. Here, an AR coating layer 291 or 292 may be disposed at opposite sides of a cover layer 290.

In FIG. 9A, ceramic layers 210c and 210d constituting the sidewall of a cavity may be perpendicular to the bottom of the cavity and the ceramic layers 210c and 210d may have different widths (horizontal lengths in FIG. 8A). Particularly, the width of the ceramic layer 210d may be less than that of the ceramic layer 210c such that the size of the cavity gradually increases upward. In FIG. 9B, ceramic layers 210c and 210d constituting the sidewall of a cavity may have the same tilt but the ceramic layers 210c and 210d may have different widths (horizontal lengths in FIG. 9B). The different configurations of the ceramic layers may be used based on desired light emission characteristics as well as manufacturing processes.

Figure 10:
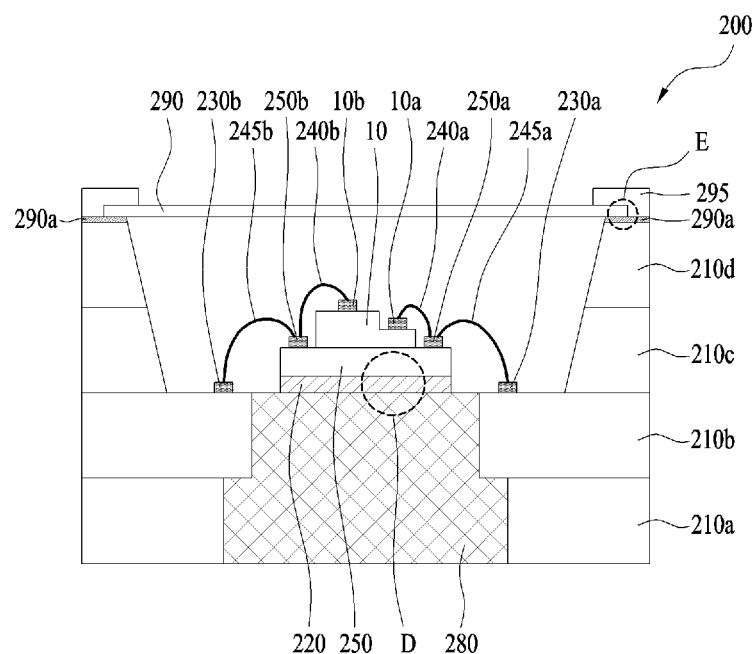
FIG. 10 is a view showing a light emitting device package of the present disclosure.
Figure 11A:
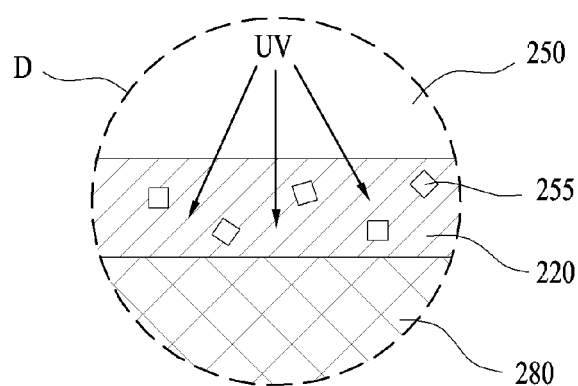
FIG. 11A is a detailed view showing a region C of FIG. 10.
Figure 11B:
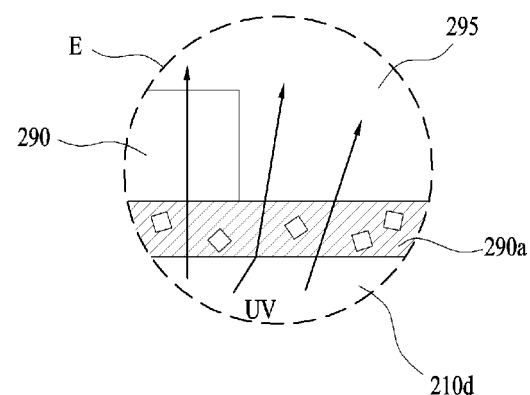
FIG. 11B is a detailed view showing a region D of FIG. 10.

FIG. 10 is a view showing a light emitting device package according to another example. FIGS. 11A and 11B are views of portions D and E of FIG. 10, respectively. Hereinafter, merely for convenience, a description will focus on differences from the above embodiments, but it should be appreciated that various features previously described may be incorporated herein.

Referring to FIGS. 10 and 11A, an inorganic paste layer 220 may be formed of only inorganic matter 225 without inclusion of organic matter, such as carbon compounds. More specifically, the inorganic paste layer 220 may include conductive or nonconductive inorganic matter 225. Particularly, the inorganic paste layer 220 may include at least one of Au, Ag, or Sn, or another appropriate type of inorganic material.

When ultraviolet (UV)-wavelength light is emitted from a light emitting device 10, the inorganic matter 225 in the inorganic paste layer 220 does not react with UV as illustrated in FIG. 11A. Consequently, the inorganic paste layer 220 may not be subject to discoloration and coupling force thereof may not be reduced.

In FIG. 10, a cover layer 290 may be disposed on an uppermost ceramic layer 210d. The cover layer 290 may be formed of transparent glass. The cover layer 290 may be coupled to the ceramic layer 210d via an inorganic paste layer 290a. The inorganic paste layer 290a may have the same composition as the inorganic paste layer 220 as described above.

In another example, the cover layer 290 and the ceramic layer 210d may be fixed by eutectic bonding or welding to hermetically seal the interior of a cavity. A lead 295 may be disposed at the edge of the cover layer 290 to hermetically seal the edge of the cover layer 290.

Referring to FIGS. 10 and 11B, the inorganic paste layer 290a may be formed of only inorganic matter without inclusion of organic matter, such as carbon compounds. More specifically, the inorganic paste layer 290a may include conductive or nonconductive inorganic matter. Particularly, the inorganic paste layer 290a may include at least one of Au, Ag, or Sn, or another appropriate type of inorganic material.

When ultraviolet (UV)-wavelength light is emitted from the light emitting device 10, the inorganic matter in the inorganic paste layer 290a does not react with UV as illustrated in FIG. 11B. Consequently, the inorganic paste layer may not be subject to discoloration and coupling force thereof may not be reduced.

Figure 12A:
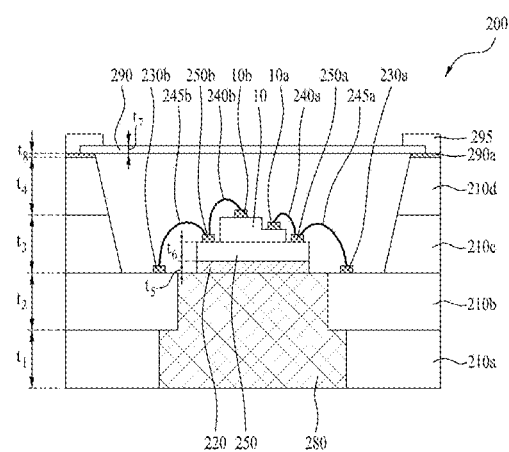
FIG. 12A is a detailed view showing a structure of the light emitting device package of FIG. 10.

FIG. 12A is a detailed view showing a structure of the light emitting device package of FIG. 10. Thicknesses t1, t2, t3, and t4 of the ceramic layers 210a, 201b, 210c, and 210d may be substantially equal to one another. A thickness t5 of the conductive paste layer 220 and a thickness t6 of the submount 250 may be less than the thickness t3 of the ceramic layer 210c. In addition, a thickness t7 of the cover layer 290 may be less than the thickness t3 of the ceramic layer 210c and a thickness t8 of the conductive paste layer 290a may be less than the thickness t7 of the cover layer 290.

Figure 12B:
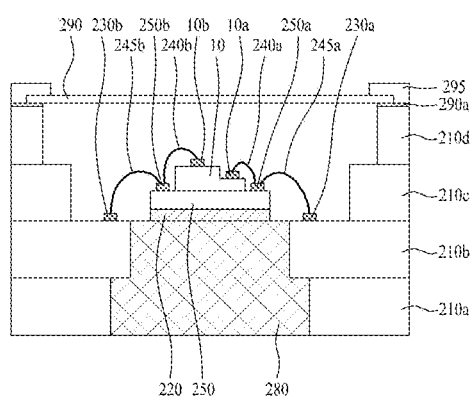
FIGS. 12B to 12D are views illustrating a configuration of the light emitting device package of FIG. 10.
Figure 12C:
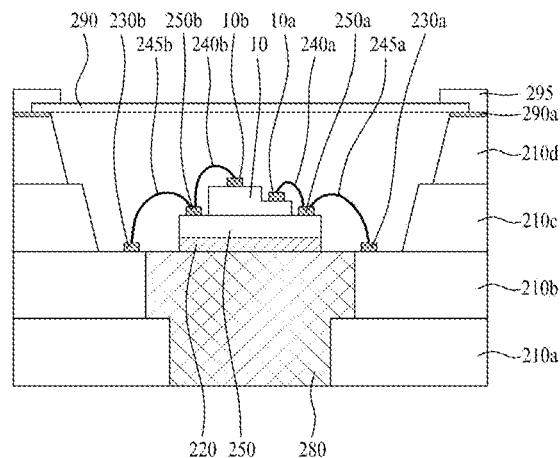
Figure 12D:
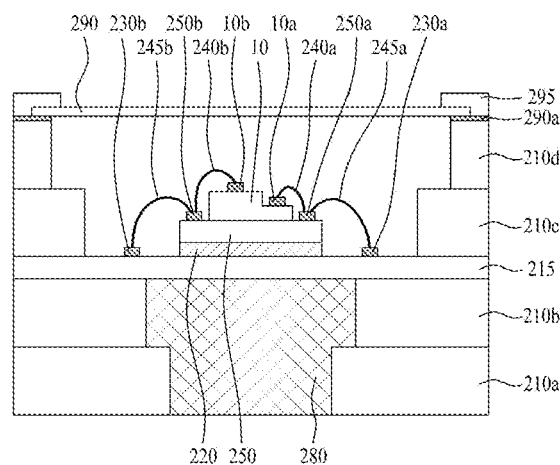

FIGS. 12B to 12D are views showing light emitting device packages according to the present disclosure. In FIG. 12A, ceramic layers 210c and 210d constituting the sidewall of a cavity may have the same tilt. For example, the side surface of the cavity may be linear and inclined at a prescribed angle. In FIG. 12B, on the other hand, ceramic layers 210c and 210d constituting the sidewall of the cavity may be perpendicular to the bottom of the cavity and the ceramic layers 210c and 210d may have different widths (horizontal lengths in FIG. 12B). Particularly, the width of the ceramic layer 210d may be less than that of the ceramic layer 210c such that the size of the cavity gradually increases upward.

In FIG. 12C, ceramic layers 210c and 210d constituting the sidewall of a cavity may have the same tilt (or inclined angle), but the ceramic layers 210c and 210d may have different widths (horizontal lengths in FIG. 12C). For example, a step may be formed on the sidewall of the cavity. Furthermore, in FIG. 12C, a heat sink 280 may have upper and lower widths which are different from those of the heat sink of previously described examples. That is, the width of the heat sink 280 at the height corresponding to the ceramic layer 210b may be greater than that of the heat sink 280 at the height corresponding to the ceramic layer 210a. Even when the ceramic layers 210a and 210b are compressed or cooled due to heat or other causes, therefore, the heat sink 280 may be prevented from being separated downward from the ceramic layers 210a and 210b.

In FIG. 12D, structures of ceramic layers 210c and 210d constituting the sidewall of a cavity may be identical to that shown in FIG. 12B and structures of ceramic layers 210a and 210b and a heat sink 280 may be identical to that shown in FIG. 12C.

Figure 13A:
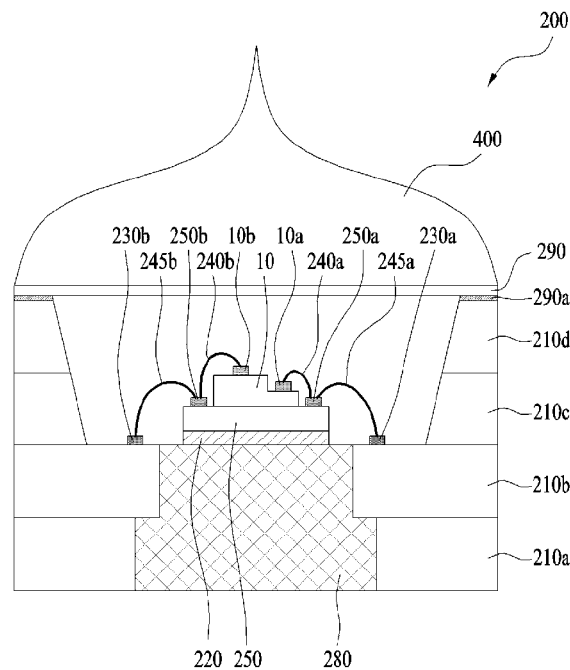
FIGS. 13A to 13C are views showing a light emitting device package of the present disclosure.
Figure 13B:
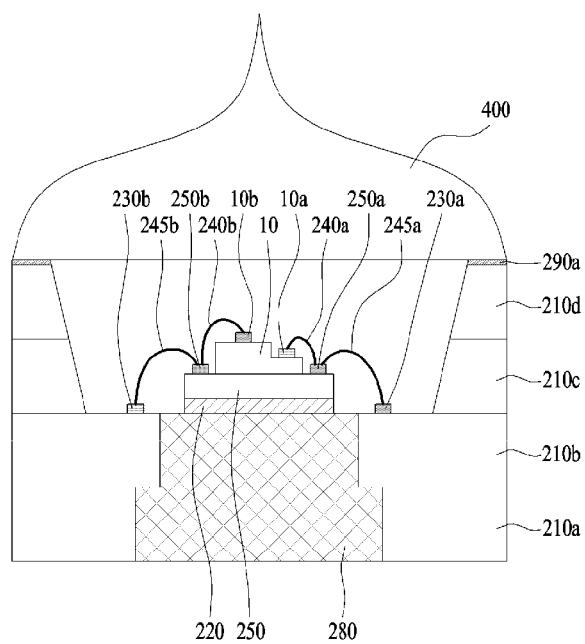
Figure 13C:
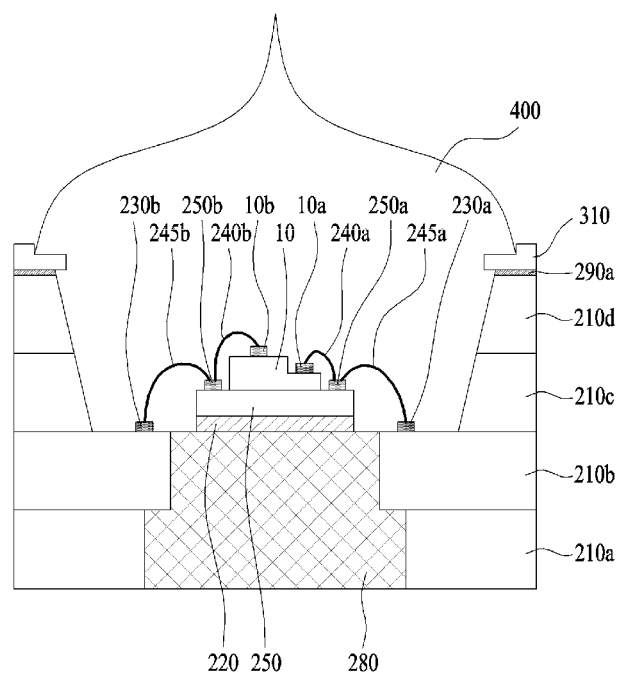

FIGS. 13A to 13C are views showing a light emitting device package according to the present disclosure. Hereinafter, merely for convenience, the description will focus on differences from previously described examples of the light emitting device packages. But it should be appreciated that various features previously described may be incorporated herein.

A cover layer 290 may be disposed on an uppermost ceramic layer 210d and a lens 400 may be disposed on the cover layer 290. The cover layer 290 may be formed of transparent glass. The cover layer 290 may be coupled to the ceramic layer 210d via an inorganic paste layer 290a. The inorganic paste layer 290a may have the same composition as the inorganic paste layer 220 as described above. In another example, the cover layer 290 and the ceramic layer 210d may be fixed by eutectic bonding or welding to hermetically seal the interior of a cavity.

The lens 400 may be disposed at the uppermost part of a package body. The lens 300 may be formed of silicon or epoxy. Alternatively, the lens 400 may be formed of inorganic matter.

The inorganic paste layer 290a may be formed of only inorganic matter without inclusion of organic matter, such as carbon compounds. More specifically, the inorganic paste layer 290a may include conductive or nonconductive inorganic matter. Particularly, the inorganic paste layer 290a may include at least one of Au, Ag, or Sn, or another appropriate type of inorganic material. When ultraviolet (UV)-wavelength light is emitted from a light emitting device 10, therefore, the inorganic matter in the inorganic paste layer 290a does not react with UV. Consequently, the inorganic paste layer may not be subject to discoloration and coupling force thereof may not be reduced.

Figure 14A:
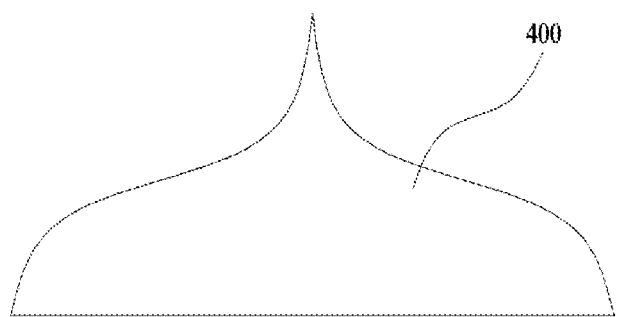
FIG. 14A is a sectional view of a lens shown in FIGS. 13A to 13C.
Figure 14B:
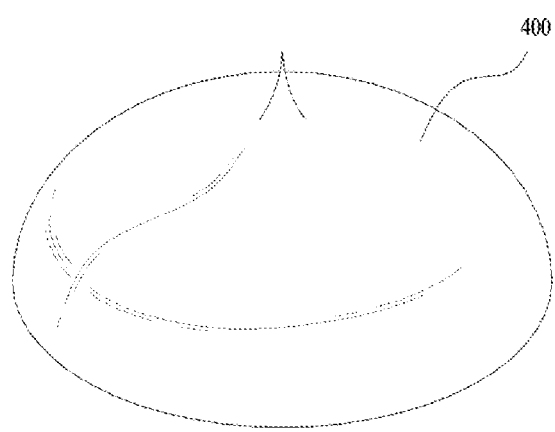
FIG. 14B is a perspective view of the lens shown in FIGS. 13A to 13C.

FIG. 14A is a sectional view of the lens shown in FIGS. 13A to 13C and FIG. 14B is a perspective view of the lens shown in FIGS. 13A to 13C. A light incidence part of the lens 400 facing the light emitting device may have a flat surface and a light exit part of the lens 400 opposite to the light emitting device may have a conical surface with one inflection point.

The surface of the light exit part of the lens 400 may be symmetric with respect to the inflection point. The surface of the light exit part of the lens 400 may have a radius of curvature set to converge light exiting the lens 400.

Figure 15A:
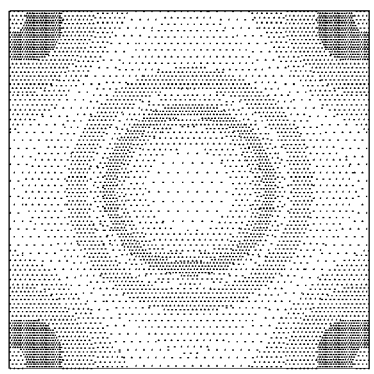
FIG. 15A is a view showing illuminance distribution of light emitted from the light emitting device package of FIGS. 13A to 13C.

FIG. 15A is a view showing illuminance distribution of light emitted from the light emitting device package of FIGS. 13A to 13C and FIG. 15B is a view showing orientation distribution of light emitted from the light emitting device package of FIGS. 13A to 13C.

Figure 15B:
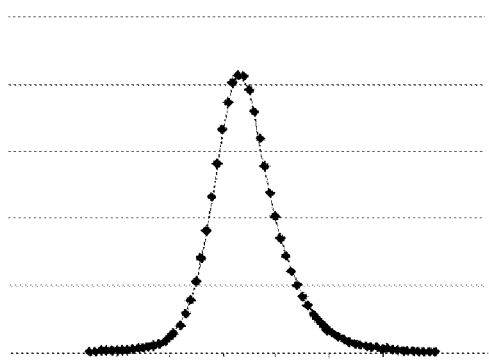
FIG. 15B is a view showing orientation distribution of light emitted from the light emitting device package of FIGS. 13A to 13C.

FIG. 15A shows illuminance distribution of light emitted from the light emitting device package measured at the top of the light emitting device package. FIG. 15B shows orientation distribution of light emitted from the light emitting device package. In FIG. 15B, the vertical axis indicates orientation distribution of light and the horizontal axis indicates location of the light emitting device package. The left side of FIGS. 15A and 15B corresponds to one end of the light emitting device package, a region having the greatest orientation distribution corresponds to the middle of the light emitting device package, and the right side of the Figures corresponds to the other end of the light emitting device package.

As shown in FIGS. 15A and 15B, light emitted from the light emitting device package converges on the region corresponding to the middle of the light emitting device package such that the light is symmetric with respect to the region corresponding to the middle of the light emitting device package.

The light emitting device package shown in FIG. 13B is similar to the embodiment shown in FIG. 13A except that the cover layer is omitted and the lens 400 is disposed at the uppermost ceramic layer 210d of the package body in contact. In this case, the lens 400 may be coupled to the ceramic layer 210d via the inorganic paste layer 290a.

The light emitting device package shown in FIG. 13C is similar to the embodiment shown in FIG. 13B except that a lead 310 is disposed at the uppermost ceramic layer 210d of the package body and the lens 400 is fixed to the lead 310. The lead 310 may be coupled to the ceramic layer 210d via the inorganic paste layer 290a. The lead 310 may include a first inside region 310a and a second outside region 310b, which form a step. The first region 310a may have a height less than that of the second region 310b. The edge of the lens 200 may be disposed at the first region 310a.

In the light emitting device package of FIGS. 13A to 13C, light emitted from the light emitting device may converge on the region corresponding to the middle of the light emitting device package such that the light is symmetric with respect to the region corresponding to the middle of the light emitting device package.

The above embodiments of the light emitting device package may include one or more light emitting device. However, embodiments are not limited thereto. A plurality of light emitting device packages may be arrayed on a board to implement a display apparatus, a sterilization apparatus, and a light apparatus including the light emitting device packages. Hereinafter, a sterilization apparatus and a light apparatus including the light emitting device packages will be described.

Figure 16:
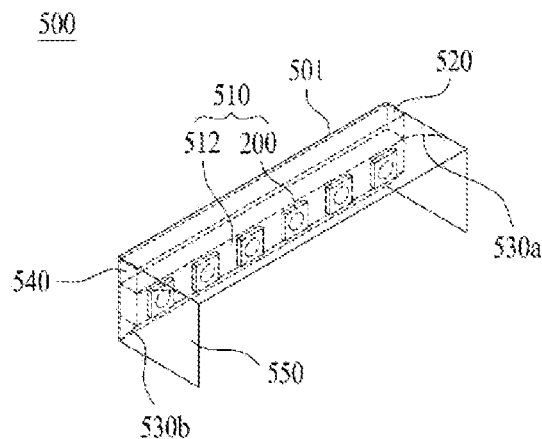
FIG. 16 is a view showing an embodiment of a sterilization apparatus including light emitting device packages of the present disclosure.

FIG. 16 is a view showing an embodiment of a sterilization apparatus including light emitting device packages. The sterilization apparatus 500 may include a light emitting module 510 mounted at one surface of a housing 501, diffused reflection members 530a and 530b for diffusely reflecting deep UV-wavelength light emitted from the light emitting module 510, and a power supply 520 for supplying available power necessary for the light emitting module 510.

The housing 501 may be configured to have a rectangular structure. The housing 501 may have an integrated compact structure in which the light emitting module 510, the diffused reflection members 530a and 530b, and the power supply 520 are mounted. In addition, the housing 501 may be formed of a material suitable for effectively discharging heat generated in the sterilization apparatus 500 and in a shape suitable for effectively discharging heat generated in the sterilization apparatus 500. For example, the housing 510 may be formed of any one selected from among Al, Cu, or an alloy thereof. Consequently, efficiency of heat transfer between the housing 501 and external air may be increased, thereby improving heat dissipation characteristics of the sterilization apparatus 500.

Alternatively, the housing 501 may have a unique outer surface shape. For example, the outer surface of the housing 501 may have a corrugated, mesh, or non-specific irregular pattern. Consequently, efficiency of heat transfer between the housing 501 and external air may be further increased, thereby improving heat dissipation characteristics of the sterilization apparatus 500.

Meanwhile, an attachment plate 550 may be further disposed at each end of the housing 501. As illustrated in FIG. 16, the attachment plate 550 may be a bracket-function member used to fix the housing 510 to the facilities. The attachment plate 550 may protrude from each end of the housing 501 in a prescribed direction. The prescribed direction may be an inward direction of the housing 501 in which deep UV is emitted and diffusely reflected.

Consequently, the attachment plate 550 disposed at each end of the housing 501 may provide a fixing area between the housing 501 and the facilities such that the housing 501 can be more effectively fixed to the facilities. The attachment plate 550 may be implemented by a screw fastening means, a rivet fastening means, a bonding means, or a fitting means. These various coupling means are well known in the art and, therefore, a detailed description thereof will be omitted.

Meanwhile, the light emitting module 510 may be disposed at one surface of the housing 510 in a surface mounting fashion. The light emitting module 510 may serve to emit deep UV for sterilizing microorganisms in air. To this end, the light emitting module 510 may include a board 512 and a plurality of light emitting device packages 200 mounted on the board 512.

When UV-, deep UV-, or near UV-wavelength light is emitted from a light emitting device of each light emitting device package 200 as described above, inorganic matter in an inorganic paste layer does not react with UV, deep UV, or near UV. Consequently, the inorganic paste layer may not be discolored and coupling force thereof may not be reduced. In addition, light emitted from the light emitting device may converge on a region corresponding to the middle of each light emitting device package such that the light is symmetric with respect to the region corresponding to the middle of each light emitting device package as described above.

The board 512 may be disposed along the inside of the housing 510 in a single line. The board 512 may be a printed circuit board (PCB) including a circuit pattern (not shown). The board 512 may include a metal core PCB (MCPCB) and a flexible PCB in addition to a general PCB. However, embodiments are not limited thereto.

The diffused reflection members 530a and 530b may be reflective sheet type members for forcibly diffusely reflecting deep UV emitted from the light emitting module 510. The diffused reflection members 530a and 530b may have various front shapes and may be disposed in various forms. The surface structure (e.g. the radius of curvature, etc.) of each of the diffused reflection members 530a and 530b may be changed step by step to irradiate diffusely reflected deep UV in an overlapping fashion such that irradiation intensity of deep UV is increased or a width of an area to which deep UV is irradiated is increased.

The power supply 520 may serve to supply available power necessary for the light emitting module 510. The power supply 520 may be disposed in the housing 501. As shown in FIG. 16, the power supply 520 may be disposed at an inner wall in a space between the diffused reflection members 530a and 530b and the light emitting module 510. A power connection unit 550 for electric connection between external power and the power supply 520 may be further disposed to introduce the external power to the power supply 520.

As shown in FIG. 16, the power connection unit 550 may be formed in a flat shape. Alternatively, the power connection unit 550 may be formed in the shape of a socket or a cable slot to which an external power cable may be electrically connected. The power cable may be flexible such that the power cable may be easily connected to the external power.

Figure 17:
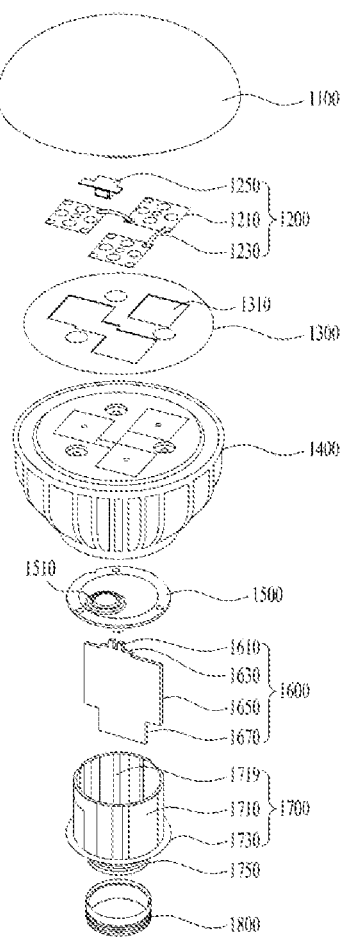
FIG. 17 is a view showing an embodiment of a lighting apparatus including light emitting device packages of the present disclosure.

FIG. 17 is a view showing a lighting apparatus including light emitting device packages. The lighting apparatus may include a cover 1100, a light source module 1200, a heat sink 1400, a power supply 1600, an inner case 1700, and a socket 1800. In addition, the lighting apparatus may further include a member 1300 and a holder 1500. The light source module 1200 may include the light emitting device packages according to the previous embodiments. When UV-, deep UV-, or near UV-wavelength light is emitted from a light emitting device of each light emitting device package as described above, therefore, inorganic matter in an inorganic paste layer does not react with UV, deep UV, or near UV. Consequently, the inorganic paste layer may not be subject to discoloration and coupling force thereof may not be reduced. In addition, light emitted from the light emitting device may converge on a region corresponding to the middle of each light emitting device package such that the light is symmetric with respect to the region corresponding to the middle of each light emitting device package as described above.

The cover 1100 may be formed in the shape of a bulb or a hemisphere. The cover 1100 may be hollow. A portion of the cover 1100 may be open. The cover 1100 may be optically coupled to the light source module 1200. For example, the cover 1100 may diffuse, scatter, or excite light emitted from the light source module 1200. The cover 1100 may be a kind of optical member. The cover 1100 may be referred to as a bulb or lens. The cover 1100 may be coupled to the heat sink 1400. The cover 1100 may have a coupling part coupled to the heat sink 1400.

The inside of the cover 1100 may be coated with a milky or translucent paint. The milky paint may include a diffusion material for diffusing light. The inside of the cover 110 may have surface roughness greater than that of the outside of the cover 1100 such that light emitted from the light source module 1200 can be sufficiently scattered and diffused before exiting outward.

The cover 1100 may be formed of glass, plastic, polypropylene (PP), polyethylene (PE), polycarbonate (PC), or another appropriate type of material. PC exhibits high light-fastness, heat resistance, and strength. The cover 1100 may be transparent such that the light source module 1200 is visible from outside the cover or may be opaque. The cover 1100 may be formed through blow molding.

The light source module 1200 may be disposed at one surface of the heat sink 1400. Consequently, heat generated from the light source module 1200 is conducted to the heat sink 1400. The light source module 1200 may include light emitting device packages 1210, a connection plate 1230, and a connector 1250.

The member 1300 may be disposed on the top of the heat sink 1400. The member 1300 may have guide grooves 1310, in which the light emitting device packages 1210 and the connector 1250 are inserted. The guide grooves 1310 may correspond to substrates of the light emitting device packages 1210 and the connector 1250.

A light reflective material may be applied to or coated on the surface of the member 1300. For example, a white paint may be applied to or coated on the surface of the member 1300. The member 1300 may reflect light reflected by the inside of the cover 1100 and returning to the light source module 1200 such that the light is directed to the cover 1100, thereby improving light efficiency of the lighting apparatus according to the embodiment.

The member 1300 may be formed of an insulative material. The connection plate 1230 of the light source module 1200 may include an electrically conductive material, by which electrical connection between the heat sink 1400 and the connection plate 1230 may be achieved. The member 1300 may be formed of an insulative material for preventing a short circuit between the connection plate 1230 and the heat sink 1400. The heat sink 1400 may dissipate heat generated from the light source module 1200 and heat generated from the power supply 1600.

The holder 1500 may cover a reception groove 1719 of an insulative part 1700 of the inner case 1700. Consequently, the power supply 1600 received in the insulative part 1700 of the inner case 1700 may be hermetically sealed. The holder 1500 may have a guide protrusion 1510. The guide protrusion 1510 may have a hole through which a protrusion 1610 of the power supply 1600 extends.

The power supply 1600 may process or convert an external electrical signal and supply the processed or converted signal to the light source module 1200. The power supply 1600 may be received in the reception groove 1719 of the inner case 1700 and may be hermetically sealed in the inner case 1700 by the holder 1500. The power supply 1600 may further include a guide 1630, a base 1650, and an extension 1670 in addition to the protrusion 1610.

The guide 1630 may be formed in a shape protruding outward from one side of the base 1650. The guide 1630 may be inserted into the holder 1500. A plurality of components may be disposed on one surface of the base 1650. The components may include a direct current converter for converting alternating current power supplied from an external power source into direct current power, a drive chip for controlling driving of the light source module 1200, and an electrostatic discharge (ESD) protection device for protecting the light source module 1200. However, embodiments are not limited thereto.

The extension 1670 may be formed in a shape protruding outward from the other side of the base 1650. The extension 1670 may be inserted into a connection part 1750 of the inner case 1700 for receiving an external electrical signal. For example, the extension 1670 may have a width equal to or less than that of the connection part 1750 of the inner case 1700. One end of a positive cable and one end of a negative cable may be electrically connected to the extension 1670 and the other end of the positive cable and the other end of the negative cable may be electrically connected to the socket 1800.

A molding part may be disposed in the inner case 1700 in addition to the power supply 1600. The molding part, which is formed by solidified molding liquid, may fix the power supply 1600 in the inner case 1700.

As is apparent from the above description, embodiments provide a light emitting device package in which properties of a light emitting device is prevented from being reduced due to moisture or air penetrating the light emitting device package, a paste layer is prevented from reacting with UV emitted from the light emitting device and thus being discolored, and a view angle of light emitted from the light emitting device package is improved.

In one embodiment, a light emitting device package may include a package body having a first surface and a second surface opposite the first surface, a cavity being formed on the first surface such that a ledge is formed at the top of the cavity, a submount provided in the cavity, a light emitting device provided over the submount for emitting ultraviolet (UV) light, the light emitting device having a first conductive type semiconductor layer, an active layer on the first conductive type semiconductor layer, and a second conductive type semiconductor layer, and a cover provided over the ledge to cover the cavity, and at least one inorganic layer provided on the cover.

At least one inorganic layer may be provided on an upper surface of the cover away from the light emitting device or on a lower surface of the cover toward the light emitting device. Moreover, a first and second inorganic layers may be formed of at least one of Au, Ag or Sn.

A mounting layer may be provided between the submount and the package body in the cavity, the mounting layer being formed of an inorganic material. The inorganic material of the mounting layer may be at least one of Au, Ag or Sn.

A coating layer may be provided to cover outer surfaces of the light emitting device, the submount, and the mounting layer the coating layer being formed of an inorganic material. The inorganic material for the coating layer may be at least one of $MgF_2$, $SiO_2$ or $TiO_2$.

A bonding layer may be provided between the ledge on the package body and the cover, the bonding layer being formed of an inorganic material. The inorganic material of the bonding layer may be at least one of Au, Ag or Sn.

A width of the mounting layer and the submount may be greater than a width of the light emitting device. A light emitting device package may further include a plurality of electrodes provided on the light emitting device package and the submount. A coating layer may be provided adjacent to the plurality of electrodes to expose the plurality of electrodes.

At least one inorganic layer provided on the cover may include a first inorganic layer provided on the upper surface of the cover and a second inorganic layer provided on the lower surface of the cover. The light emitting device package may further include a mounting layer provided between the submount and the package body in the cavity. The mounting layer may be formed of inorganic material.

A coating layer may be provided to cover outer surfaces of the light emitting device, the submount, and the mounting layer. The coating layer may be formed of inorganic material, which may be at least one of $MgF_2$, $SiO_2$ or $TiO_2$. A light emitting device package may further include a bonding layer provided between the ledge on the package body and the cover, the bonding layer being formed of an inorganic material. The inorganic material may be at least one of Au, Ag or Sn.

The light emitting device may be a lateral type configured to emit light in a lateral direction. The light emitting device package may further include a first electrode provided on a top surface of the light emitting device and connected to the first conductive type semiconductor layer, a second electrode provided on an upper surface of the second conductive type semiconductor layer, and a coating layer provided to cover outer surfaces of the light emitting device. The coating layer may be provided adjacent the first and second electrodes to expose the electrodes, and may be formed of an inorganic material. The light emitting device package may further include a mounting layer provided between the submount and the package body in the cavity. Moreover, the mounting layer may be formed of an inorganic material.

The light emitting device may be a vertical type configured to emit light in a vertical direction. An electrode may be provided on a top surface of the light emitting device and connected to the first conductive type semiconductor layer, and a coating layer provided to cover an outer surface of the light emitting device. The coating layer may be provided adjacent the first and second electrodes to expose the electrodes. Moreover, the coating layer may be formed of inorganic material. A mounting layer provided between the submount and the package body in the cavity. The mounting layer may be formed of inorganic material. Moreover, the light emitting device package may further include a passivation layer provided on lateral surfaces of the light emitting device.

In one embodiment, a light emitting device package is provided wherein an AR coating layer disposed around a light emitting device at at least one side of a cover layer may prevent moisture or air from penetrating a cavity such that optical or electrical properties of the light emitting device are not reduced.

In one embodiment, a light emitting device package is provided wherein, when UV-, deep UV-, or near UV-wavelength light is emitted from a light emitting device, inorganic matter in an inorganic paste layer does not react with UV, deep UV, or near UV. Consequently, the inorganic paste layer may not be discolored and coupling force thereof may not be reduced.

In one embodiment, a light emitting device package is provided in which light emitted from a light emitting device may converge on a region corresponding to the middle of the light emitting device package such that the light is symmetric with respect to the region corresponding to the middle of the light emitting device package.

In one embodiment, a light emitting device package includes a package body including at least one ceramic layer, a submount disposed at the package body, a light emitting device disposed on the submount for emitting ultraviolet (UV)-wavelength light, and an anti-reflection (AR) coating layer disposed around the light emitting device, the AR coating layer being formed of an inorganic coating layer.

In another embodiment, a light emitting device package includes a package body including at least one ceramic layer, the package body having a cavity, a submount contacting the ceramic layer at a bottom of the cavity via an inorganic paste layer, and a light emitting device disposed on the submount for emitting UV-wavelength light.

In a further embodiment, a light emitting device package includes a package body including at least one ceramic layer, the package body having a cavity, a light emitting device disposed at a bottom of the cavity, and a lens disposed at an uppermost end of the package body, wherein the lens has a surface with at least one inflection point.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
   a package body having a first surface and a second surface opposite the first surface, a cavity being formed on the first surface such that a ledge is formed at the top of the cavity;
   a submount provided in the cavity, wherein the submount is not used as an electrode;
   a heat sink provided at the bottom of the cavity, including at least one surface exposed externally at the package body;
   an inorganic paste layer provided to bond the submount onto the heat sink, the inorganic paste layer being thermally conductive and nonreactive with UV light;
   a light emitting device eutectically bonded, using a metal, to the submount for emitting ultraviolet (UV) light, the light emitting device having a first conductive type semiconductor layer, an active layer on the first conductive type semiconductor layer, and a second conductive type semiconductor layer;
   a cover provided over the ledge to cover the cavity;
   at least one inorganic layer provided between the cover and the cavity;
   at least one inorganic coating layer formed of only inorganic matter is provided on an upper surface of the cover away from the light emitting device or on a lower surface of the cover toward the light emitting device;
   an electrode provided on a top surface of the light emitting device and connected to the first conductive type semiconductor layer;
   a coating layer provided to cover an outer surface of the light emitting device; and
   a passivation layer provided on lateral surfaces of the light emitting device,
   wherein the light emitting device is a vertical type configured to emit light in a vertical direction, and
   wherein the coating layer formed of inorganic material is provided adjacent first and second electrodes to expose the first and second electrodes.

2. The light emitting device package of claim 1, wherein the at least one inorganic layer is formed of at least one of Au, Ag or Sn.

3. The light emitting device package of claim 1, wherein the inorganic paste layer includes at least one of Au, Ag or Sn.

4. The light emitting device package of claim 3, wherein the coating layer is provided to cover outer surfaces of the light emitting device, the submount, and the inorganic paste layer.

5. The light emitting device package of claim 4, wherein the inorganic material for the coating layer is at least one of $MgF_2$, $SiO_2$ or $TiO_2$.

6. The light emitting device package of claim 5, further including a bonding layer provided between the ledge on the package body and the cover, the bonding layer formed of an inorganic material.

7. The light emitting device package of claim 6, wherein the inorganic material of the bonding layer is at least one of Au, Ag or Sn.

8. The light emitting device package of claim 1, wherein widths of the inorganic paste layer and the submount are greater than a width of the light emitting device.

9. The light emitting device package of claim 4, further including a plurality of electrodes provided on the light emitting device and the submount, wherein the coating layer is provided adjacent to the plurality of electrodes to expose the plurality of electrodes.

10. The light emitting device package of claim 1, wherein the at least one inorganic layer provided on the cover includes a first inorganic layer provided on the upper surface of the cover and a second inorganic layer provided on the lower surface of the cover.

11. The light emitting device package of claim 1, further including a coating layer provided to cover outer surfaces of the light emitting device, the submount, and the inorganic paste layer, wherein the coating layer is formed of inorganic material.

12. The light emitting device package of claim 11, wherein the inorganic material for the coating layer is at least one of $MgF_2$, $SiO_2$ or $TiO_2$.

13. The light emitting device package of claim 1, further including a bonding layer provided between the ledge on the package body and the cover, the bonding layer formed of an inorganic material.

14. The light emitting device package of claim 1, wherein the at least one inorganic layer includes at least one of Au, Ag or Sn.

15. The light emitting device package of claim 1, further comprising a lens disposed at an uppermost end of the package body, wherein the lens has a surface with at least one inflection point.

* * * * *